United States Patent
Lin et al.

(10) Patent No.: US 9,337,103 B2
(45) Date of Patent: May 10, 2016

(54) METHOD FOR REMOVING HARD MASK OXIDE AND MAKING GATE STRUCTURE OF SEMICONDUCTOR DEVICES

(71) Applicant: Taiwan Semiconductor Manufacturing Co., Ltd., Hsin-Chu (TW)

(72) Inventors: Yi-An Lin, Taipei (TW); Chun-Wei Chang, Taoyuan (TW); Neng-Kuo Chen, Sinshih Township (TW); Sey-Ping Sun, Hsinchu (TW); Clement Hsingjen Wann, Carmel, NY (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/707,769

(22) Filed: Dec. 7, 2012

(65) Prior Publication Data

US 2014/0162446 A1    Jun. 12, 2014

(51) Int. Cl.
*H01L 21/3205*    (2006.01)
*H01L 21/8234*    (2006.01)

(52) U.S. Cl.
CPC .............................. *H01L 21/823437* (2013.01)

(58) Field of Classification Search
USPC .......................... 438/585, 692; 257/288, 408
See application file for complete search history.

(56) References Cited

U.S. PATENT DOCUMENTS

| | | | |
|---|---|---|---|
| 6,406,956 B1 | 6/2002 | Tsai et al. | |
| 6,689,665 B1 | 2/2004 | Jang et al. | |
| 6,756,277 B1 | 6/2004 | Yu | |
| 6,855,602 B2 | 2/2005 | Chang et al. | |
| 6,863,592 B2* | 3/2005 | Lee et al. | 451/36 |
| 7,037,821 B2 | 5/2006 | Kim | |
| 7,361,565 B2 | 4/2008 | Shin et al. | |
| 8,008,145 B2 | 8/2011 | Liao et al. | |
| 8,153,526 B2* | 4/2012 | Lee et al. | 438/692 |
| 2002/0168857 A1* | 11/2002 | Kobayashi | 438/689 |
| 2003/0214013 A1 | 11/2003 | Lee et al. | |
| 2005/0124109 A1 | 6/2005 | Quevedo-Lopez et al. | |
| 2005/0233598 A1 | 10/2005 | Jung et al. | |
| 2006/0019033 A1 | 1/2006 | Muthukrishnan et al. | |
| 2007/0077865 A1* | 4/2007 | Dysard et al. | 451/41 |
| 2010/0041236 A1 | 2/2010 | Lin et al. | |
| 2010/0062577 A1* | 3/2010 | Liao et al. | 438/301 |
| 2011/0256731 A1* | 10/2011 | Lee et al. | 438/763 |
| 2012/0094504 A1 | 4/2012 | Yao et al. | |
| 2012/0264279 A1* | 10/2012 | Lu et al. | 438/585 |

OTHER PUBLICATIONS

Revera, The Material, Replacement Gate Process, 2 pages, retrieved from http://www.revera.com/VeraFlex/hkmg_approachesReplacement.htm.

* cited by examiner

*Primary Examiner* — Reema Patel
*Assistant Examiner* — Syed Gheyas
(74) *Attorney, Agent, or Firm* — Haynes and Boone, LLP

(57) ABSTRACT

A method includes forming a first gate above a semiconductor substrate, forming a hard mask on the first gate, and forming a contact etch stop layer (CESL) on the hard mask. No hard mask is removed between the step of forming the hard mask and the step of forming the CESL. The method further includes forming an interlayer dielectric (ILD) layer over the CESL, and performing one or more CMP processes to planarize the ILD layer, remove the CESL on the hard mask, and remove at least one portion of the hard mask.

20 Claims, 7 Drawing Sheets

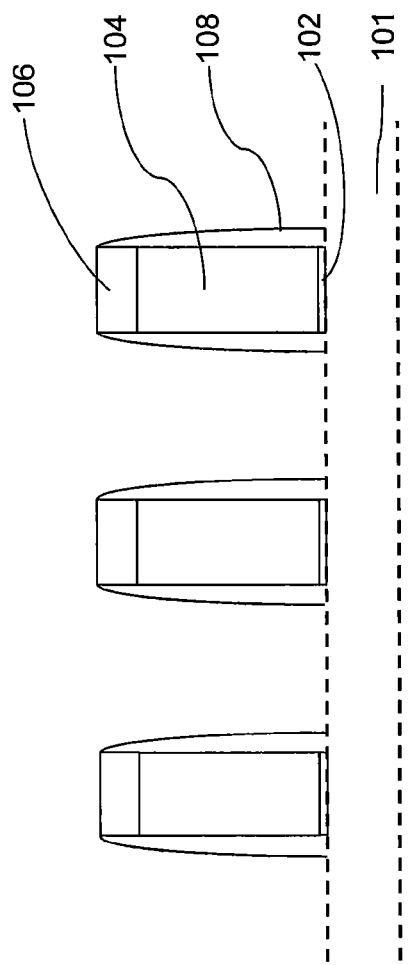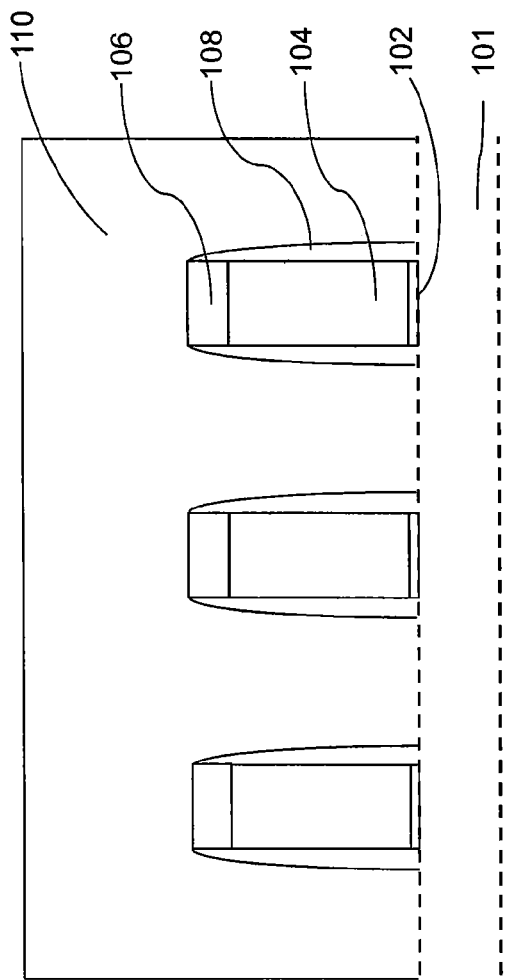

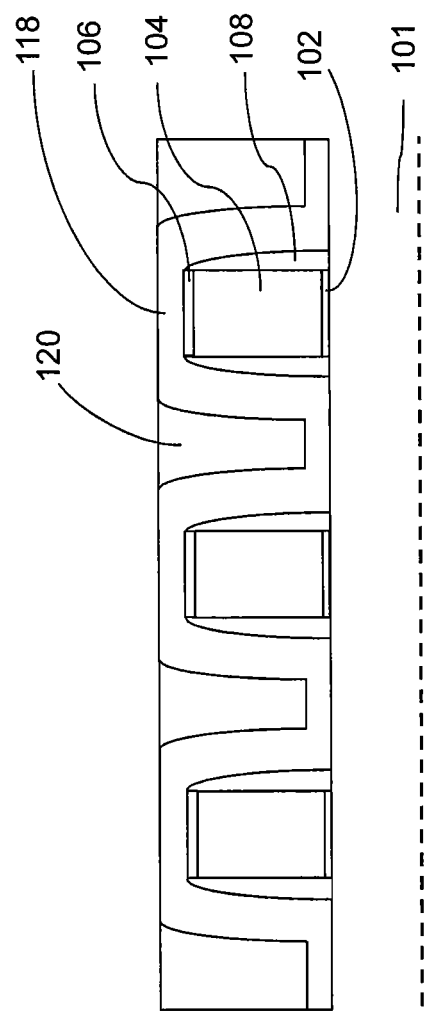
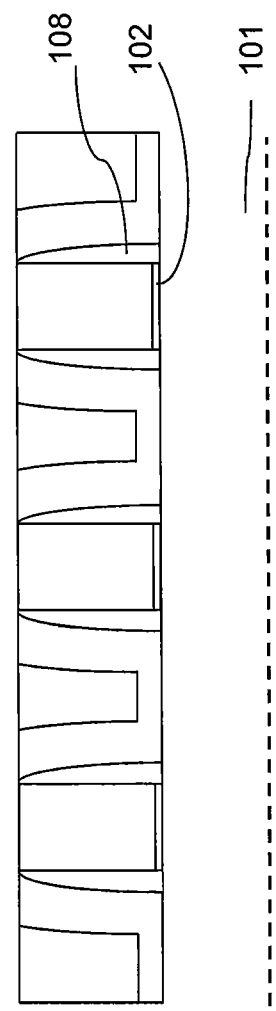
FIG. 5
FIG. 6

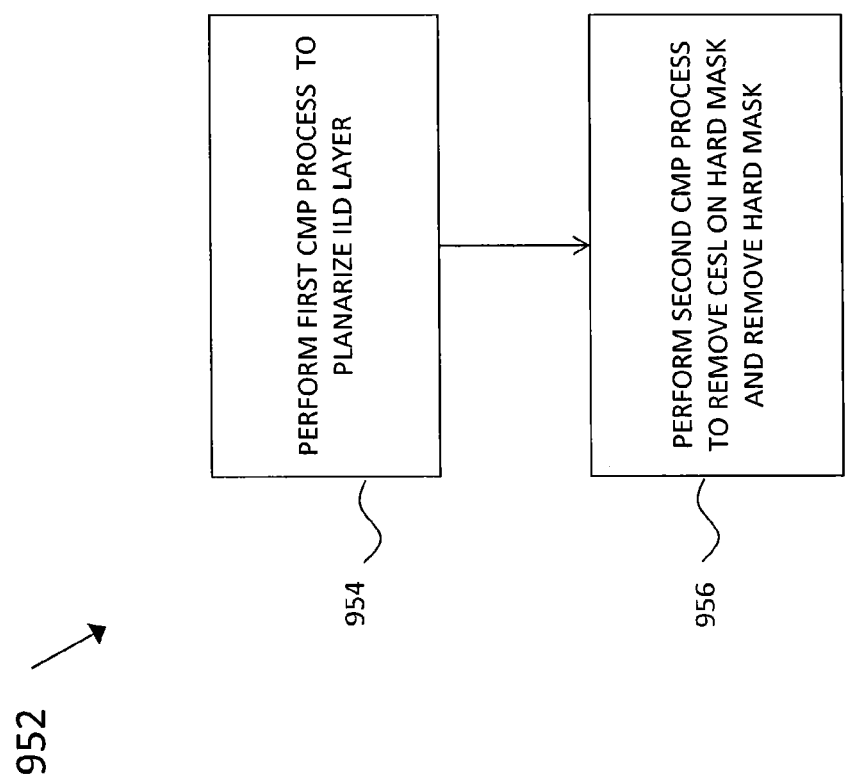

METHOD FOR REMOVING HARD MASK OXIDE AND MAKING GATE STRUCTURE OF SEMICONDUCTOR DEVICES

FIELD

This disclosure relates to a method of forming semiconductor devices. More particularly, the disclosed subject matter relates to a process for fabrication of a replacement gate structure of a semiconductor device.

BACKGROUND

Chemical mechanical polishing/planarization (CMP) is a key process for smoothing surfaces of semiconductor wafers through both chemical etching and physical abrasion. A semiconductor wafer is mounted onto a polishing head, which rotates during a CMP process. The rotating polishing head presses the semiconductor wafer against a rotating polishing pad. Slurry containing chemical etchants and colloid particles is applied onto the polishing pad. Irregularities on the surface are removed resulting in planarization of the semiconductor wafer.

Complementary metal oxide semiconductor (CMOS) transistors are building blocks for integrated circuits, and CMOS devices continue to be scaled to smaller sizes for advanced performance targets. CMOS technology includes N-type metal oxide semiconductor (NMOS) and P-type metal oxide semiconductor (PMOS) transistors.

A CMOS transistor generally comprises a semiconductor substrate, a channel layer above the semiconductor substrate, a gate oxide layer and a gate stack above the channel layer, and source and drain diffusion regions in the surface of the semiconductor substrate. Contacts are made to the gate stack, and to both the source and drain regions of the transistor. With the advent of high-k dielectric materials as the gate insulating layer in the CMOS process, metal gates or metal layers can be used in the devices.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawings.

FIG. 1 is a cross-sectional view of a portion of a semiconductor device illustrating an exemplary first gate formed above a semiconductor substrate in accordance with some embodiments.

FIG. 2 illustrates a cross-sectional view of the device portion of FIG. 1 comprising a photoresist layer.

FIG. 5 illustrates the device portion of FIG. 4 after performing a first CMP process in accordance with some embodiments.

FIG. 6 illustrates the device portion of FIG. 5 after performing a second CMP process in accordance with some embodiments.

FIG. 11 is a flow chart diagram illustrating an exemplary method comprising at least two CMP processes in some embodiments.

DETAILED DESCRIPTION

Figure 3:
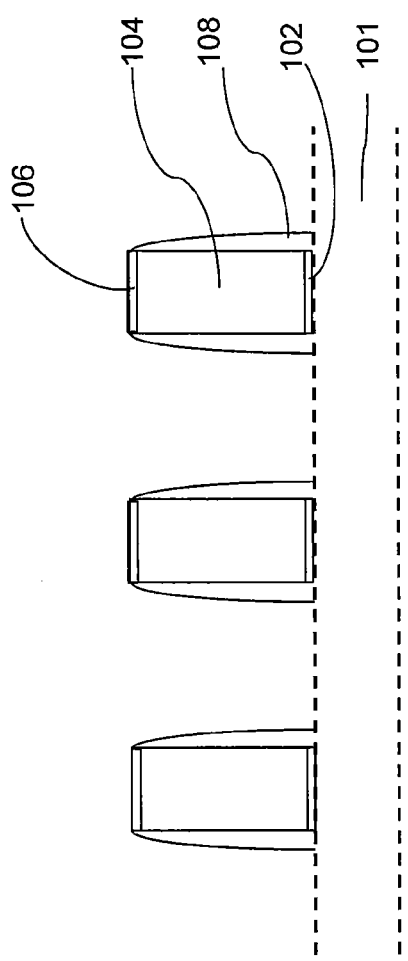
FIG. 3 is a cross-sectional view of the device portion of FIG. 2 after processes of removing the hard mask and the photoresist layer.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

CMOS devices continue to be scaled to smaller sizes to meet advanced performance targets. Fabrication of devices with such small dimensions involves precise controls. For example, the smaller device size provides lower limits for material loss, which is measured by device height, and variation in device height of a polished surface after a CMP cycle. Meanwhile, the size of semiconductor wafers has increased to improve throughput and reduce cost per die. For example, in the transition from 300 mm to 450 mm wafer size, the wafer area increases by 125%. The uniformity in smoothness of the whole wafer surface becomes more difficult to maintain in the more-than-doubled-sized wafer.

During fabrication of a semiconductor device such as a CMOS transistor, a replacement gate process is commonly used to make the gate electrode. In a replacement gate process, a first gate comprising a polysilicon gate and hard mask oxide is formed first. Through techniques involving photolithography and CMP, the first gate is then etched and a metal gate structure is formed as a replacement gate for the final device.

The present disclosure provides a method of removing a hard mask on a gate, and a method of making a metal gate during fabrication of a semiconductor device. In some embodiments, a method comprises: forming a first gate above a semiconductor substrate; forming a hard mask on the first gate; and forming a contact etch stop layer (CESL) on the hard mask. In some embodiments, the CESL is formed directly on the hard mask without removal of the hard mask between forming the hard mask and forming the CESL. The method also comprises forming an interlayer dielectric (ILD) layer over the CESL; and performing one or more CMP processes to planarize the ILD layer, remove the CESL on the hard mask, and remove at least one portion of the hard mask. In some embodiments, the first gate is removed and a second gate structure is then formed. In some embodiments, the first gate is a dummy gate comprising a material such as polysilicon. The second gate structure can comprise a conductive electrode comprising metal or metal compound.

Figure 7:
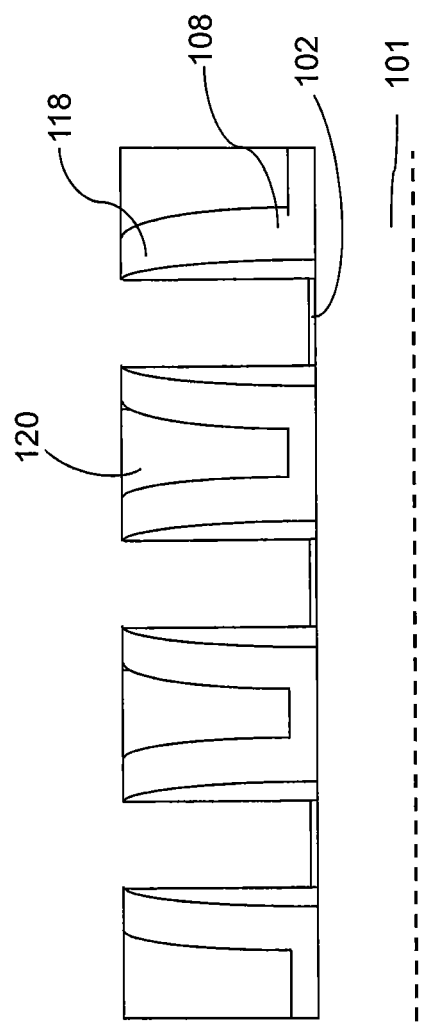
FIG. 7 illustrates the device portion of FIG. 6 after removing the first gate in accordance with some embodiments.
Figure 8:
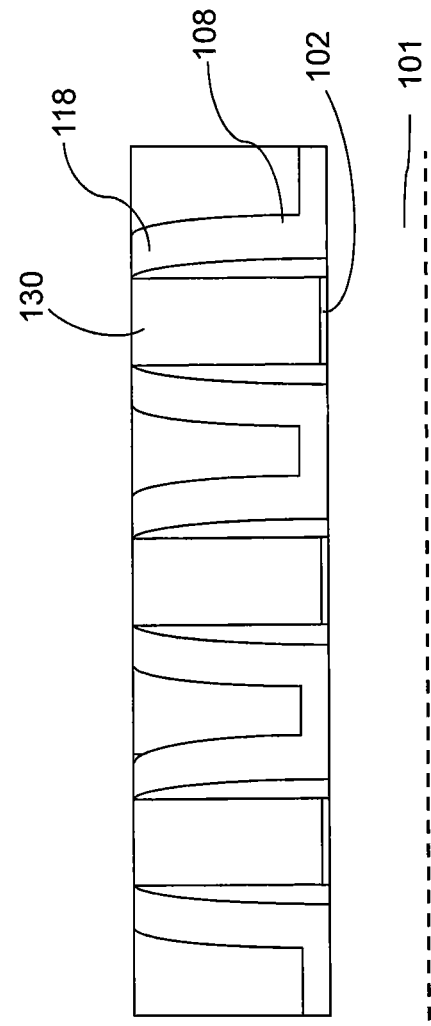
FIG. 8 illustrates the device portion of FIG. 7 after forming a second gate structure in accordance with some embodiments.
Figure 9:
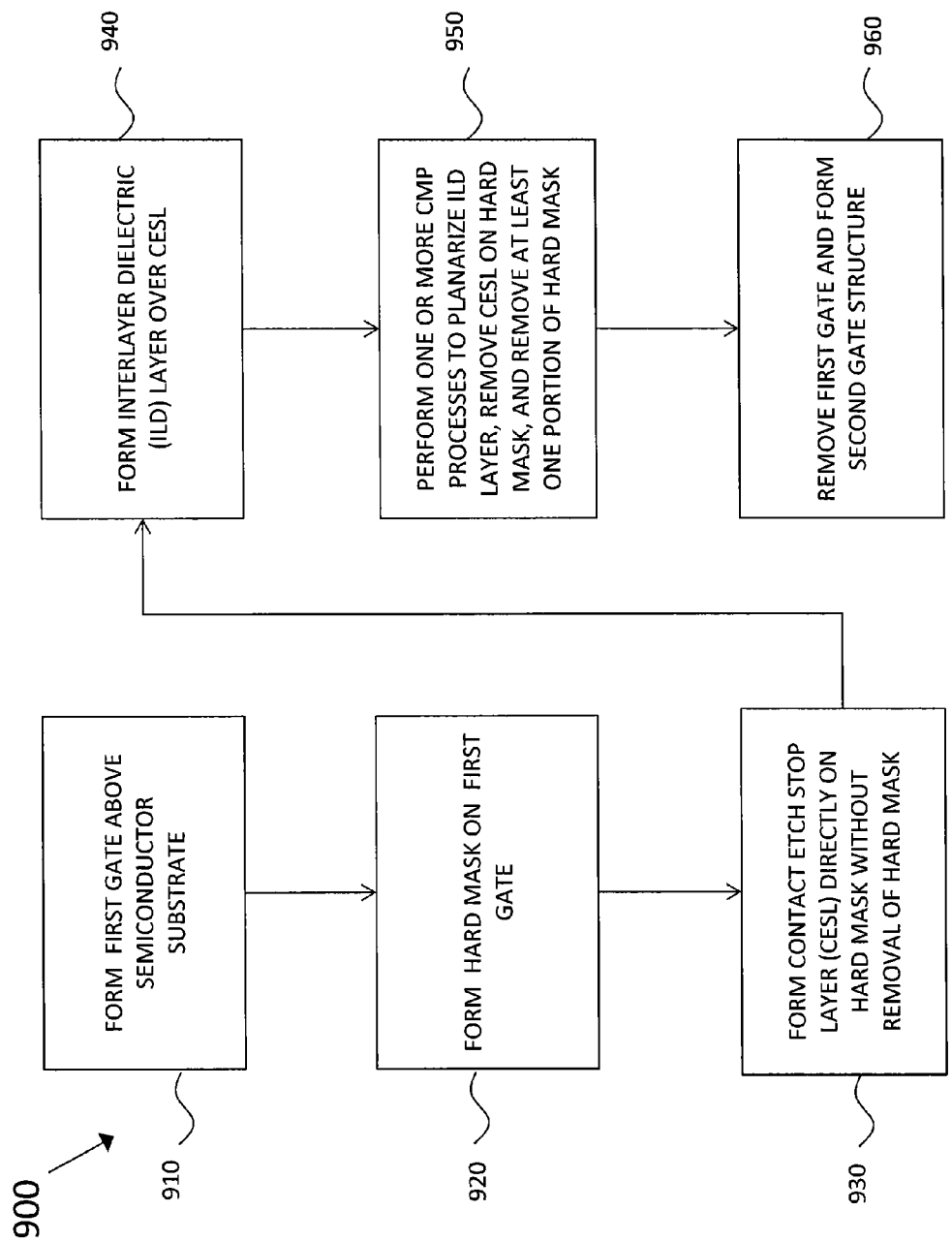
FIG. 9 is a flow chart diagram illustrating an exemplary method in accordance with some embodiments.
Figure 10:
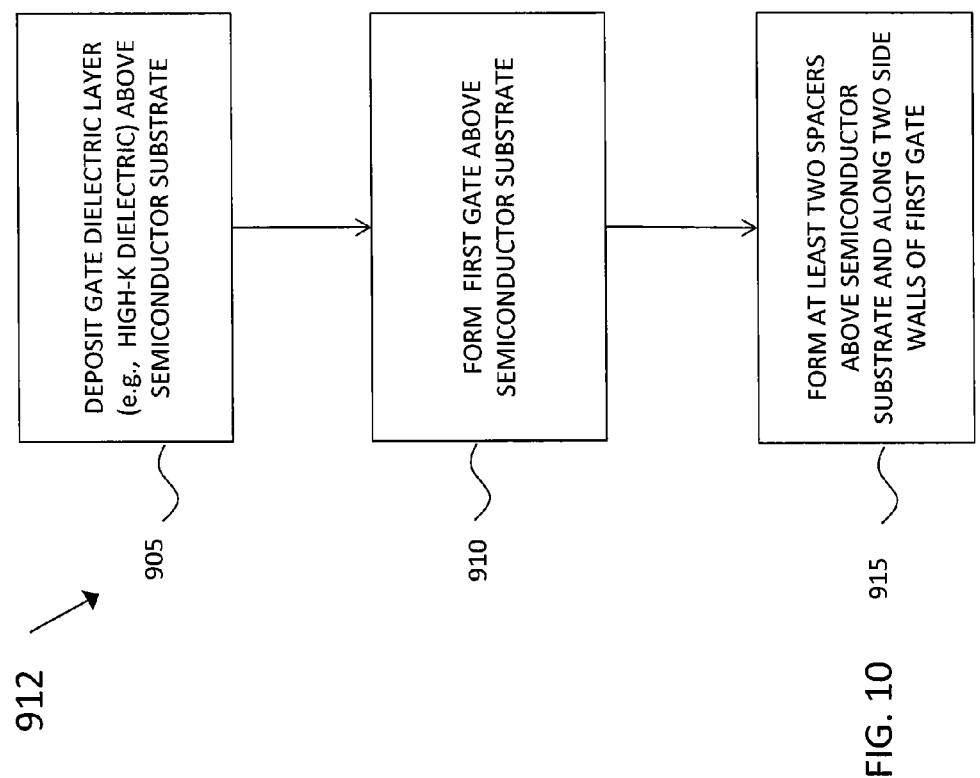
FIG. 10 is a flow chart diagram illustrating an exemplary method comprising forming additional structures besides the first gate in some embodiments.

Unless expressly indicated otherwise, references to "gate," "gate structure" or "gate stack" made in this disclosure will be understood to encompass a portion of a semiconductor device comprising at least one conductive plug or electrode, for example, above a channel layer of the semiconductor device. Such a gate or gate structure can also comprise other layers of materials such as diffusion barrier. The disclosed methods also apply to the process of making the conductive contacts connected to both the source and drain regions of a semiconductor device. In FIGS. 1-11, like items are indicated by like reference numerals, and for brevity, descriptions of the structure, provided above with reference to the previous figures, are not repeated. The methods described in FIGS. 9-11 are described with reference to the exemplary structures described in FIGS. 1-8.

FIG. 9 is a flow chart diagram illustrating an exemplary method 900 in accordance with some embodiments. In step 910, a first gate 104 is formed above a semiconductor substrate 101. Referring to FIG. 1, in some embodiments, a portion of a semiconductor device comprises a first gate 104 formed above a semiconductor substrate 101. Substrate 101 is shown in phantom in FIG. 1.

Substrate 101 can be a wafer comprising a semiconductor material. Examples of suitable materials for substrate 101 include but are not limited to silicon, germanium, a compound semiconductor, and a semiconductor-on-insulator (SOI) substrate. A compound semiconductor can be an III-V semiconductor compound such as gallium arsenide (GaAs). An SOI substrate can comprise a semiconductor on an insulator such as glass.

The method can also comprise forming other portions (not shown) of a semiconductor device on or above substrate 101. For example, the other portions can include one or more of a buffer layer, an isolator layer or isolation structure such as a shallow trench isolation (STI) structure, a channel layer, a source region and a drain region. The method can comprise in-situ doping to form a source region and a drain region in the surface of substrate 101. A gate dielectric layer 102 is formed on the surface of substrate 101.

The first gate 104 is formed on the gate dielectric layer 102. The first gate 104 comprises any suitable material in any suitable configuration. Examples of suitable materials for the first gate include but are not limited to amorphous silicon, polysilicon, polysilicon/germanium, aluminum, copper, titanium, tantalum, tungsten, molybdenum, platinum, tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. The conductive material of the first gate 104 may be doped or undoped. In some embodiments, the first gate 104 includes a work function layer tuned to have a proper work function for enhanced performance of the field effect transistor devices of an integrated circuit. For example, where the field effect transistor devices are NFETs, the work function layer includes an n-type work function metal (n-metal), such as Ta, TiAl, TiAlN, TaCN, other n-type work function metal, or a combination thereof. Where the field effect transistor device is a PFET, the work function layer includes a p-type work function metal (p-metal), such as TiN, TaN, other p-type work function metal, or combination thereof. In some embodiments, a conductive layer, such as an aluminum layer, is formed over the work function layer, such that the first gate 104 includes a work function layer disposed over the gate dielectric layer 102 and a conductive layer disposed over the work function layer. In some embodiments, the first gate 104 comprises polysilicon. In some embodiments, the first gate 104 is a dummy gate which is to be replaced by a second gate.

In some embodiments, additional structures such as a spacer 108 are also formed after forming the first gate 104, respectively, in step 910. FIG. 10 is a flow chart diagram illustrating an exemplary method 912 comprising forming additional structures besides the first gate 104 in some embodiments.

In step 905 of FIG. 10, a gate dielectric layer 102 is deposited on or above the semiconductor substrate 101 before forming the first gate at step 910. In some embodiments, the gate dielectric layer 102 comprises a high-k dielectric material. Examples of a high-k dielectric material include but are not limited to hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), tantalum pentaoxide ($Ta_2O_5$), aluminum oxide ($Al_2O_3$), titanium dioxide ($TiO_2$), and combinations thereof. Alternatively, in some embodiments, gate dielectric layer 102 is formed on an interfacial layer, such as an oxide layer, on or above semiconductor substrate 101. The first gate 104 is disposed on the gate dielectric layer 102.

In step 915 of FIG. 10, at least two spacers 108 can be formed above the semiconductor substrate 101 after forming the first gate 104. The at least two spacers 108 are disposed along two side walls of the first gate 104. Spacers 108 can be formed of oxides, nitrides, oxynitrides, combination thereof and other suitable insulating materials. In some embodiments, spacers are formed of silicon nitrides (e.g., $Si_3N_4$).

Referring back to FIG. 9, in step 920, a hard mask 106 is formed on the first gate 104. Examples of a suitable material for hard mask 106 include but are not limited to silicon oxide, silicon nitride (e.g., $Si_3N_4$), SiON, SiC, SiOC, or any combination thereof. In some embodiments, hard mask 106 comprises silicon oxide. An exemplary structure is shown in FIG. 1 after forming a hard mask 106 on the first gate 104.

In some embodiments, hard mask layer 106 can be formed using processes such as: spin coating of a photoresist, patterning the photoresist, etching the photoresist to provide a pattern, and using the photoresist pattern as a masking element to pattern hard mask layer 106, for example, using an etching process, and/or other suitable processes.

In some examples, a photoresist layer 110 is disposed over the semiconductor device, which has the first gate 104 and hard mask 106, as illustrated in FIG. 1. FIG. 2 illustrates a cross-sectional view of the device portion of FIG. 1 comprising photoresist layer 110. Photoresist layer 106 can be applied after forming hard mask in some embodiments. Photoresist 110 may or may not cover top surfaces of hard mask 106. If photoresist 110 covers top surface of hard mask 106, photoresist 110 is etched back to expose top surface of hard mask 106. Examples of a suitable etching process include but are not limited to using oxygen plasma.

In one embodiment, hard mask 106 is removed through a suitable hard mask removal etch process such as a wet etch, and dry etch (e.g., RIE, plasma etch). After the removal of hard mask 106, photoresist layer 110 is then completely removed through a wet removal process. For example, photoresist layer 110 can be stripped by a solution comprising an ingredient such as $H_2SO_4$, $H_2O_2$, and $NH_4OH$. FIG. 3 illustrates the device portion of FIG. 2 after processes of removing hard mask 106 and photoresist layer 110.

In FIG. 3, photoresist layer 110 is used, and removal of hard mask 106 is targeted in the processed described above. However, the inventors have determined that keeping the hard mask 106 at this stage and removing the hard mask during CMP is advantageous. By keeping the hard mask until CMP is performed, gate height loss is reduced, removal of hard mask 106 is more complete, residues (FIG. 2) are reduced, poly line-end rounding is reduced, and variation in surface topography and height are reduced. These factors can reduce problems to the downstream processes and final device structure. For example, reduction in gate height loss and surface variation can lead to higher gate height and improved uniformity of the second gate to be made as described below. Therefore, the present disclosure provides a method without removal of hard mask 106 between forming hard mask 106 and forming a contact etch stop layer (CESL) 118, in accordance with some embodiments. The present disclosure provides a method of removing a hard mask 106 on a gate in the downstream processes involving a CESL 118 and an interlayer dielectric (ILD) layer 120.

In step 930 of FIG. 9, a contact etch stop layer (CESL) 118 is directly formed on hard mask 106 without removal of hard mask 106 between the step of forming hard mask 106 and the step of forming the CESL 118. This step starts from a device shown in FIG. 1 or 3. For the purpose of illustration, hard mask 106 is not completely removed in FIG. 3. FIGS. 1 and 3 illustrate identical structures except for the thickness of hard mask 106. For brevity of description, the structures shown in FIG. 4 and subsequent drawings are understood to encompass the processes starting from the structures illustrated in either FIG. 1 or FIG. 3.

The CESL 118 can be formed of silicon nitride, silicon oxynitride, silicon carbide, silicon oxycarbide, combinations thereof, or other suitable materials. In some embodiments, the CESL 118 is formed of silicon nitride. The CESL 118 can be formed by using chemical vapor deposition (CVD), high density plasma CVD, sputtering, or other suitable method.

Figure 4:
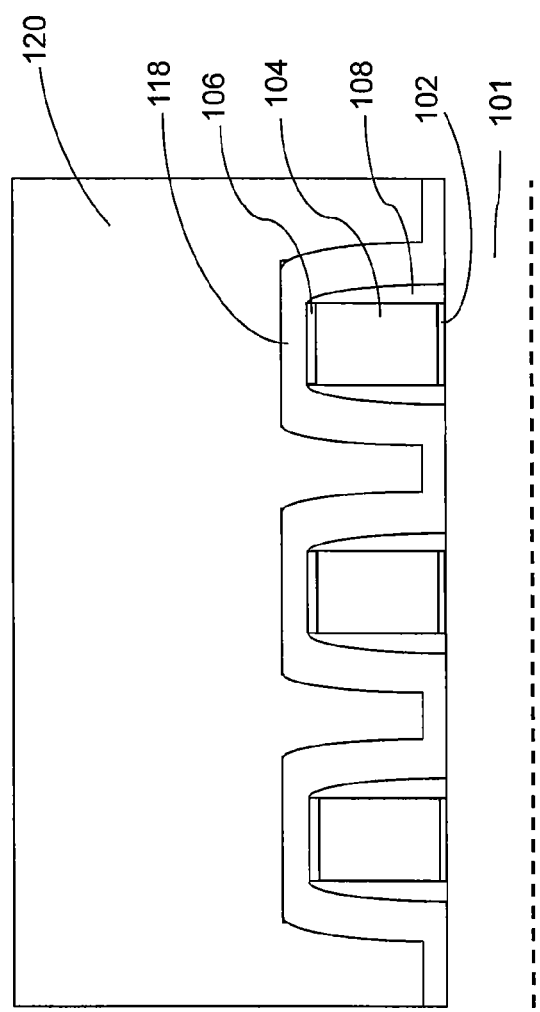
FIG. 4 illustrates the device portion of FIG. 3 or FIG. 1 after forming a contact etch stop layer (CESL) directly on the hard mask and an interlayer dielectric (ILD) layer over the CESL in accordance with some embodiments.

In step 940 of FIG. 9, an interlayer dielectric (ILD) layer is formed over the CESL 118. FIG. 4 illustrates the device portion of FIG. 3 or FIG. 1 after forming the CESL 118 directly on hard mask 106 and the ILD layer 120 over the CESL 118 in accordance with some embodiments.

Examples of suitable materials for the ILD layer 120 include but are not limited to silicon oxide, silicon oxynitride, phosphosilicate galss (PSG), borophosphosilicate glass (BPSG), combinations thereof, or other suitable material. The ILD layer 120 can be formed by using CVD, high density plasma CVD, spin-on, sputtering, or other suitable method.

In step 950 of FIG. 9, one or more CMP processes are performed to planarize the ILD layer 120, remove the CESL 118 on hard mask 106, and remove at least one portion of the hard mask 106. In some embodiments, after the performing one or more CMP processes, substantially all of hard mask 106 is removed after the performing one or more CMP processes.

The one or more CMP processes are understood to encompass any combinations of one or more than one CMP processes. For example, only one CMP process is used in some embodiments. In some other embodiments, the one or more CMP processes include a first and a second CMP process, and different types of slurry are used in the performing the first and second CMP processes. FIG. 11 is a flow chart diagram illustrating an exemplary method 952 comprising at least two CMP processes in some embodiments.

In step 954 of FIG. 11, a first CMP process is performed to planarize the ILD layer 120 by removing a portion of the ILD layer 120. In some embodiments, the slurry used in the first CMP process has high selectivity in removing the ILD layer 120 over the CESL 118. The selectivity is with reference to a ratio of removal rates of the ILD layer 120 to the CESL 118 under the same conditions. In one embodiment, for example, such a selectivity ratio is higher than 5:1. Alternatively, such a selectivity ratio is higher than 10:1 or 15:1. In another embodiment, such a ratio is in the range of from 30:1 to 60:1. In some embodiments, a slurry with a high selectivity can make the first CMP process easier to control. In some embodiments, a first slurry used in the first CMP process has low selectivity because the target of the first CMP performed on the ILD layer 120 only is to achieve a planar and smooth surface. Examples of suitable ingredients for the first slurry include but are not limited to fumed silica and alumina, suspended in an aqueous solution of a pH range, for example, in the range of about 9 to about 12. In some other embodiments, the first slurry used in the first CMP process has low selectivity because the first CMP process stops when the top surface of the CESL layer is exposed. A rotational speed, a suitable pressure and a polishing time can be chosen to achieve the target in the first CMP process. FIG. 5 illustrates the device portion of FIG. 4 after performing a first CMP process in accordance with some embodiments.

Conditions for an exemplary first CMP process are described below for illustration only. The exemplary first CMP process selectively removes the ILD layer 120, which is silicon oxide or other suitable material, and stops upon exposure of the CESL layer 118, which is silicon nitride or other suitable material. The slurry used in the first CMP process comprising ceria ($CeO_2$) particles in the range of from 0.1 μm to 0.4 μm, with a solid content in the range of from 0.05 to 3.0 wt. %. The slurry has a pH value in the range of from 3 to 6. The ratio of removal rates for the ILD layer 120 to the CESL layer 118 is in the range of from 30:1 to 60:1. In some embodiments, the slurry used in the first CMP process can be adsorbed on the surface of the CESL layer 118 (such as silicon nitride) to reduce the removal rate of the CESL layer 118 by chemical protection. By using the different removal rate for the ILD layer 120 to the CESL layer 118, an end-point of the first CMP process is selected to stop the process when the top surface of the CESL layer 118 is exposed.

In step 956, a second CMP process is performed to remove the CESL 118 on the hard mask 106, and remove the hard mask 106. In some embodiments, a second slurry different from the first slurry is used. In some embodiments, the platen used in the second CMP process is different from that used in the first CMP process. For example, the second slurry can have selectivity, with reference to a ratio of removal rates of the CESL 118 (the hard mask 106 or the ILD layer 120) to the first gate 104, so that the polishing stops after a complete removal of hard mask 106. Removal of a portion of the first gate 104 is thus avoided. In some embodiments, the ratio of removal rates of the hard mask 106 to the first gate 104, the ratio of removal rates of the ILD layer 120, and the ratio of CESL 118 to the first gate 104 are in a same or similar range. In one embodiment, for example, such a selectivity ratio is higher than 10:1. Alternatively, such a selectivity ratio is higher than 15:1 or 20:1. In another embodiments, such a ratio is in the range of from 20:1 to 80:1, such as in the range from 20:1 to 40:1. In some embodiments, a slurry with a high selectivity can make the second CMP process easier to control. Alternatively, the second slurry having a lower selectivity can be used in other embodiments. The second CMP process can be controlled with processing time. In some embodiments, where the CESL layer 118 comprises silicon nitride, the hard mask 106 and the ILD layer 120 comprise silicon oxide, the second slurry targets complete removal of the silicon nitride. In some embodiments, the second slurry comprises cerium oxide in the range of 2 nm to 50 nm. The second CMP process includes a different set of processing conditions such as rotation speed, pressure applied, and polishing time. FIG. 6 illustrates the device portion of FIG. 5 after performing a second CMP process in accordance with some embodiments.

Conditions for an exemplary second CMP process are described for illustration only. The exemplary second CMP process selectively removes the CESL layer 118, which is silicon nitride or other suitable material, then removes hard mask 106, which is silicon oxide or other suitable material. The second CMP process stops upon exposure of the top surface of the first gate 104, which is polysilicon or other suitable material. The slurry used in the second CMP process comprising silica ($SiO_2$) particles in the range of from 0.01 μm to 0.1 μm, with a solid content in the range of from 1 to 5 wt. %. The slurry has a pH value in the range of from 3 to 6. In one embodiment, the CESL layer 118 is silicon nitride, the hard mask 106 and the ILD layer 120 are silicon oxide. The first gate 104 comprises polysilicon. The ratio of removal rates for silicon nitride to polysilicon is in the range of from 20:1 to 40:1. The ratio of removal rates for silicon oxide to polysilicon is also in the range of from 20:1 to 40:1. In some embodiments, the slurry used in the second CMP process can be adsorbed on the surface of polysilicon to prevent chemical interaction between the abrasive particle in the slurry and polysilicon in the first gate 104. By using the different removal rate as described, an end-point of the second CMP process can be selected to stop the polishing process when the top surface of the first gate 104 is exposed. In some embodiments, because thickness of the hard mask 106 is predetermined, such thickness data can be used to control the polishing time of the second CMP process.

In some embodiments, after removal of hard mask 106 the first gate 104 is a gate in a semiconductor device, such as a transistor, MOS capacitor or the like. In other embodiments, as shown in step 960 of FIG. 9, the first gate 104 is removed and a second gate structure 130 is then formed. The first gate 104 is a dummy gate in some embodiments. FIG. 7 illustrates the device portion of FIG. 6 after removing the first gate 104 in accordance with some embodiments. FIG. 8 illustrates the device portion of FIG. 7 after forming a second gate structure 130 in some embodiments.

The first gate 104 can be removed using a wet etch, dry etch (e.g., RIE, plasma etch), and/or other suitable processes. In some embodiments, the first gate 104 is selectively removed using a processing gas comprising plasma, for example, a fluorine-containing plasma. In some embodiments, the first gate 104 comprising polysilicon can be selectively etched by exposure to a hydroxide-containing solution, for example, ammonia hydroxide, followed by rinsing with deionized water. In some embodiments, the first gate 104 is selectively etched without removing any of the gate dielectric layer 102.

The second gate structure 130 can comprise a conductive electrode comprising metal or metal compound. Examples of suitable materials for a conductive electrode include but are not limited Ti, TiN, TaN, Ta, TaC, TaSiN, W, WN, MoN, MoON, $RuO_2$, Al, Cu, Mo, Pt, TiAl, TiAlN, TaCN, combinations thereof, and other suitable materials. The second gate structure 130 can be a metal gate comprising one or more layers of metal or metal compounds formed by PVD, CVD, ALD, plating, or other suitable processes. Examples of suitable metals that can be deposited include p-type metal materials and n-type metal materials. P-type metal materials include but are not limited to ruthenium, palladium, platinum, cobalt, nickel, and conductive metal oxides. N-type metal materials include but are not limited to hafnium, zirconium, titanium, tantalum, aluminum, metal carbides (e.g., hafnium carbide, zirconium carbide, titanium carbide, and aluminum carbide), aluminides, and other suitable materials. In some embodiments, the second gate structure 130 includes other layers such as a diffusion barrier layer and a capping layer. The diffusion barrier layer can also comprise a metal material. A capping layer can comprise lanthanum oxide or other suitable material. In some embodiments, the second gate structure 130 includes a work function layer tuned to have a proper work function for enhanced performance of the field effect transistor devices of an integrated circuit. For example, where the field effect transistor devices are NFETs, the work function layer includes an n-type work function metal (n-metal), such as Ta, TiAl, TiAlN, TaCN, other n-type work function metal, or a combination thereof. Where the field effect transistor device is a PFET, the work function layer includes a p-type work function metal (p-metal), such as TiN, TaN, other p-type work function metal, or combination thereof. In some embodiments, a conductive layer, such as an aluminum layer, is formed over the work function layer, such that the second gate structure 130 includes a work function layer disposed over the gate dielectric layer 102 and a conductive layer disposed over the work function layer.

The present disclosure also provides a method of making a metal gate including removing a hard mask 106 during the CMP steps of fabrication of a semiconductor device, as described above. In some embodiments, the first gate comprising polysilicon is selectively removed and replaced with the second gate structure 130 comprising a conductive electrode, which comprises a metal or a metal compound, as described above.

The exemplary method 900 in FIG. 9 over the counterpart comprising a method of removing hard mask 106 after forming the CESL 118 provides advantages such as less loss in gate height and no residue of the hard mask 106 and the CESL 118.

The present disclosure provides a method of removing a hard mask on a gate, and a method of making a metal gate during fabrication of a semiconductor device. In some embodiments, a method comprises: forming a first gate above a semiconductor substrate; forming a hard mask on the first gate; and forming a contact etch stop layer (CESL) on the hard mask. In some embodiments, the CESL is formed directly on the hard mask without removal of the hard mask between the forming the hard mask and the forming the CESL. The method also comprises forming an interlayer dielectric (ILD) layer over the CESL; and performing one or more CMP processes to planarize the ILD layer, remove the CESL on the hard mask, and remove at least one portion, or substantially the entire hard mask.

The present disclosure also provides a method of making a metal gate structure. The method comprises forming a first gate above a semiconductor substrate; forming a hard mask on the first gate; and forming a contact etch stop layer (CESL) on the hard mask. In some embodiments, the CESL is formed directly on the hard mask without removal of the hard mask between the forming the hard mask and the forming the CESL. The method further comprises forming an interlayer dielectric (ILD) layer over the CESL; performing one or more CMP processes to planarize the ILD layer, remove the CESL on the hard mask, and remove the hard mask; removing the first gate and forming a second gate structure.

In some embodiments, a method in this disclosure comprises: forming a first gate above a semiconductor substrate; forming a hard mask on the first gate; and forming a contact etch stop layer (CESL) on the hard mask. In some embodiments, the CESL is formed directly on the hard mask without removal of the hard mask between the forming the hard mask and the forming the CESL. The method further comprises forming an interlayer dielectric (ILD) layer over the CESL; performing a first CMP process to planarize the ILD layer; performing a second CMP process to remove the CESL on the hard mask, and remove the hard mask; and removing the first gate and forming a second gate structure. Before the forming the first gate, a gate dielectric layer comprising a high-k dielectric material can be deposited above the semiconductor substrate. The first gate is disposed on the gate dielectric layer. After the forming the first gate, at least two spacers can be formed above the semiconductor substrate, and are disposed along two side walls of the first gate. In some embodiments, the first gate comprises polysilicon, and the first gate is a dummy gate. In some embodiments, the first gate is selectively removed using a processing gas comprising plasma. The second gate structure comprises a conductive electrode comprising a metal or a metal compound.

Although the subject matter has been described in terms of exemplary embodiments, it is not limited thereto. Rather, the appended claims should be construed broadly, to include other variants and embodiments, which can be made by those skilled in the art.

What is claimed is:

1. A method, comprising:
    forming a first gate above a semiconductor substrate;
    forming a hard mask having a first composition on the first gate;
    forming a contact etch stop layer (CESL) having a second composition, the second composition being different than the first composition, the CESL formed directly on the hard mask without removal of the hard mask between forming the hard mask and forming the CESL;
    forming an interlayer dielectric (ILD) layer, the ILD layer being formed over the CESL; and
    performing two CMP processes, the two CMP processes including
        a first CMP process with a first slurry to remove the ILD layer above a top surface of the CESL, wherein the first CMP process stops when the top surface of the CESL is exposed, and wherein the top surface of the CESL absorbs the first slurry to increase its selectivity to the first CMP process, and
        a second CMP process with a second slurry to selectively remove the CESL and remove the hard mask, wherein the second CMP process stops when a top surface of polysilicon of the first gate is exposed, and wherein the second slurry comprises silica particles and provides a removal rate of the hard mask having the first composition to the polysilicon of the first gate of approximately 20:1 to approximately 40:1.

2. The method of claim 1, further comprising:
    removing the first gate and forming a second gate structure after the performing the two CMP processes.

3. The method of claim 2, wherein
    the second gate structure comprises a conductive electrode comprising metal or metal compound.

4. The method of claim 1, further comprising:
    depositing a gate dielectric layer comprising a high-k dielectric material above the semiconductor substrate before the forming the first gate, wherein the first gate is disposed on the gate dielectric layer.

5. The method of claim 1, further comprising:
    forming at least two spacers above the semiconductor substrate after the forming the first gate, wherein the at least two spacers are disposed along two side walls of the first gate.

6. The method of claim 1, wherein the first CMP process has a selectivity ratio of removal rates of the ILD layer to the CESL in the range of from 30:1 to 60:1.

7. The method of claim 1, wherein the second CMP process has a selectivity ratio of removal rates of the CESL or the hard mask to the first gate in the range of from 20:1 to 80:1.

8. The method of claim 1, wherein
    wherein the first slurry comprises ceria (CeO$_2$) particles, has a solid content in the range of from 0.05 to 3.0 weight percent, and has a pH value in the range of from approximately 3 to approximately 6 to provide a selectivity between the ILD layer to the CESL of at least approximately 30 to 1.

9. A method of making a metal gate structure, comprising:
    forming a first gate above a semiconductor substrate;
    forming a hard mask on the first gate, wherein the hard mask is silicon oxide;
    forming a contact etch stop layer (CESL) directly on the hard mask without removal of the hard mask between forming the hard mask and forming the CESL, wherein the CESL is silicon nitride;
    forming an interlayer dielectric (ILD) layer over the CESL;
    performing two CMP processes each using a different platen, the two CMP processes including
        a first CMP process with a first slurry to selectively remove the ILD layer above a top surface of the CESL, wherein the first CMP process stops when the top surface of the CESL is exposed, wherein the first CMP process uses a first platen, and
        a second CMP process with the second slurry to selectively remove the CESL on the hard mask and remove the hard mask in the second CMP process, wherein the second CMP process stops when a top surface of polysilicon of the first gate is exposed, wherein the second CMP process uses a second platen;
        and wherein the second slurry comprises silica particles and has a pH value in the range from approximately 3 to approximately 6; and
    removing the first gate and forming a second gate structure.

10. The method of claim 9, wherein the second gate structure comprises a conductive electrode comprising a metal or a metal compound.

11. The method of claim 9, further comprising:
    depositing a gate dielectric layer comprising a high-k dielectric material above the semiconductor substrate before the forming the first gate, wherein the first gate is disposed on the gate dielectric layer.

12. The method of claim 9, further comprising:
    forming at least two spacers above the semiconductor substrate after the forming the first gate, wherein the at least two spacers are disposed along two side walls of the first gate.

13. The method of claim 9, wherein the first gate is selectively removed using a processing gas comprising plasma.

14. The method of claim 9, wherein the first CMP process has a selectivity ratio of removal rates of the ILD layer to the CESL in the range of from 30:1 to 60:1.

15. The method of claim 9, wherein the second CMP process has a selectivity ratio of removal rates of the CESL or the hard mask to the first gate in the range of from 20:1 to 80:1.

16. A method, comprising:
forming a first gate above a semiconductor substrate, wherein the first gate includes a polysilicon layer;
forming a hard mask on the polysilicon layer of the first gate;
forming a contact etch stop layer (CESL), having a different composition than the hard mask layer, directly on the hard mask without removal of the hard mask between forming the hard mask and forming the CESL;
forming an interlayer dielectric (ILD) layer over the CESL;
performing a first CMP process with a first slurry to selectively remove the ILD layer above a top surface of the CESL, wherein the first CMP process stops when the top surface of the CESL is exposed, wherein a selectivity ratio of removal rates of the ILD layer to the CESL is higher than 5:1;
determining a polishing time of a second CMP process based on a thickness of the hard mask;
performing the second CMP process with a second slurry to selectively remove the CESL on the hard mask, and remove the hard mask, wherein the second CMP process stops a top surface of polysilicon of the first gate is exposed, wherein a selectivity ratio of removal rates of the hard mask to the polysilicon layer of the first gate is higher than 10:1 and wherein the second slurry includes silica particles providing the selectivity of higher than 10:1; and
removing the first gate and forming a second gate structure after performing the second CMP process.

17. The method of claim 16, further comprising:
depositing a gate dielectric layer comprising a high-k dielectric material above the semiconductor substrate before the forming the first gate, wherein the first gate is disposed on the gate dielectric layer; and
forming at least two spacers above the semiconductor substrate after the forming the first gate, wherein the at least two spacers are disposed along two side walls of the first gate.

18. The method of claim 16, wherein the second gate structure comprises a conductive plug comprising a metal or a metal compound.

19. The method of claim 16, wherein the first gate is selectively removed using a processing gas comprising plasma.

20. The method of claim 16, wherein
the selectivity ratio of removal rates of the ILD layer to the CESL in the first CMP process is in the range of from 30:1 to 60:1; and
the selectivity ratio of removal rates of the CESL or the hard mask to the first gate the second CMP process is in the range of from 20:1 to 80:1.

* * * * *